Aug. 5, 1958 N. E. LINDENBLAD 2,846,493

N-TYPE THERMOELECTRIC DEVICES

Filed Nov. 30, 1955

INVENTOR.
NILS E. LINDENBLAD
BY J. L. Whittaker
ATTORNEY

United States Patent Office 2,846,493

Patented Aug. 5, 1958

2,846,493

N-TYPE THERMOELECTRIC DEVICES

Nils E. Lindenblad, Princeton, N. J., assignor to Radio Corporation of America, a corporation of Delaware Application November 30, 1955, Serial No. 549,960

2 Claims. (Cl. 136—5)

The present invention relates to improved thermoelectric devices. More particularly, the invention relates to improved thermoelectric devices including high melting point gold-nickel thermoelectric alloys.

When two wires of dissimilar metals have their ends joined as by brazing so as to form a continuous loop, a pair of junctions is established between the respective ends so joined. If now the two junctions are at different temperatures, an electromotive force will be set up in the circuit thus formed. This effect is called the thermoelectric or Seebeck effect and the device is called a thermocouple. Many arrangements of the two wires are possible: for example, the electromotive force may be read as a function of temperature by leaving one end of each wire unjoined and connecting them series-wise to a galvanometer. Such an arrangement is termed a thermocouple thermometer. A second junction still exists in such a thermometer and is constituted by the joinder of each of the free ends of the wires by means of the galvanometer. Alternatively, the opposite effect, that is a temperature increase and decrease, may be achieved at each one of the junctions respectively if a current is passed through the junctions. This is termed the Peltier effect.

Thermoelectric materials are classified as either n-type or p-type depending upon the direction of current flow across the cold junction formed by the thermoelectric metal and another metal when operating as a thermoelectric generator according to the well-known Seebeck effect. If the positive current direction at the cold junction is into the thermoelectric material, then it is termed an "n-type" thermoelectric material. The present invention relates to an improved thermocouple including an improved n-type thermoelectric element. The effectiveness of such elements is generally evaluated on the voltage output per °C. difference in temperature, between the current terminals of the alloy, when the cold junction is at room temperature.

An object of the invention is to provide an improved high melting point n-type thermoelectric element having a higher E. M. F. per ° C. than heretofore attainable with high melting point, ductile materials.

Another object of the invention is to provide an improved thermocouple device having a more efficient high melting point n-type thermoelectric element.

These and other objects and advantages of the invention are accomplished by providing an n-type thermoelectric alloy of gold and nickel as an element of an improved thermocouple.

Figure 1:
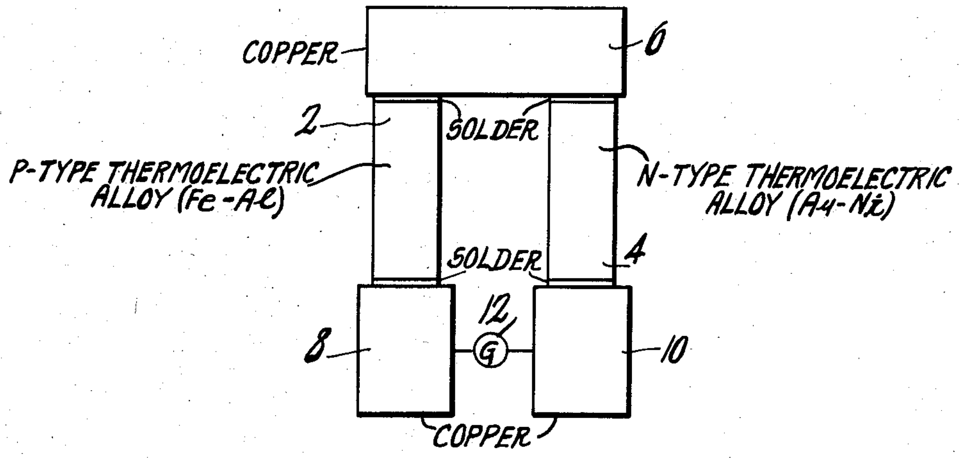
Figure 2:
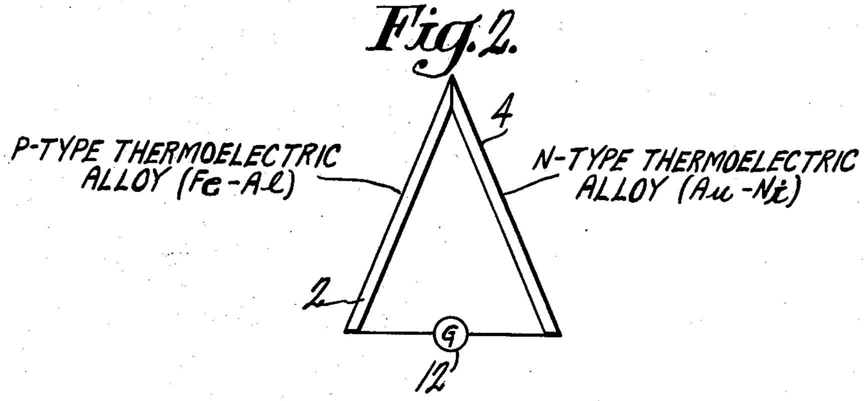

The invention will be described in greater detail with reference to the accompanying drawings in which:

Figure 1 is an elevational view illustrating one embodiment of a thermocouple device in accordance with the instant invention; and Figure 2 is an elevational view illustrating another embodiment of the thermocouple device in accordance with the instant invention.

In the art of thermoelectric high temperature measurement it is necessary that the temperature responsive element have a higher melting point than the temperature to be measured. It is also highly desirable that the element be relatively ductile so that it may be drawn or otherwise formed into various shapes and of various thicknesses such as, for example, those of a wire. In addition to these properties the thermoelectric element must be capable of producing a useful voltage (i. e., of a magnitude large enough to be read on a galvanometer or the like). Heretofore the best known n-type thermoelectric alloy having these properties was constantan (60% copper–40% nickel); its E. M. F. (with respect to copper) is about 42 microvolts per ° C.

It has been found that alloys of gold and nickel in addition to being ductile and having high melting points also have exceptionally higher thermal E. M. F.'s than prior n-type thermoelectric alloys. The alloy combination of 7 atoms of gold to 5 atoms of nickel produces an E. M. F. of 61 microvolts per ° C. This E. M. F. was obtained with a junction formed between copper and the n-type alloy according to the invention. It has been found that variations of as much as ±25% by weight in the alloy ratios of gold to nickel may be made without significantly changing the E. M. F. produced. In terms of percentages the gold may comprise from about 78 to 85.5% of the alloy. In the preferred example (7Au:5Ni) the percentage by weight of gold is about 82.5%.

These alloys are prepared by melting a mixture of the two metals in the desired proportions. These metals are readily mixed in the proportions employed and the molten alloys are cast and solidified in suitable form. Thereafter the alloyed metals, being ductile, may be drawn into wires if desired.

A typical thermocouple device using an n-type thermoelectric alloy according to the instant invention is shown in Fig. 1. The device includes an n-type thermoelectric gold-nickel alloy element 2, the alloy ratio preferably being 7 atoms of gold to 5 atoms of nickel. The p-type thermoelectric element 4 preferably consists of an alloy of iron and aluminum. Preferably this p-type thermoelectric alloy consists of 4 atoms of iron for each 3 atoms of aluminum, or, percentagewise, 26.6% by weight aluminum, balance iron. This novel p-type thermoelectric aluminum-iron alloy element is more fully described and claimed in a co-pending application for Letters Patent, Serial No. 550,019, filed Nov. 30, 1955, concurrently herewith. These elements may be in the form of wires, for example.

As shown in Figure 1, the elements 2 and 4 are silver-soldered, brazed, or welded to a copper block 6. Alternatively the ends of the elements may be directly joined one to the other by silver-soldering, brazing, or welding so as to form a single junction therebetween and the copper block 6 omitted entirely. This embodiment of the invention is shown in Figure 2. As shown in Figure 1, the free ends of the elements 2 and 4 are then silver-soldered to copper terminal wires or blocks 8 and 10 respectively. The copper terminals 8 and 10 are then connected to any appropriately calibrated device such as a galvanometer 12. The junctions formed by the elements with the copper block 6 constitute, in the case of thermometry, the sensing element in this embodiment. In the embodiment shown in Figure 2 the sensing element is the point-like junction provided by the direct joinder of the two thermoelectric elements one to the other.

Many arrangements of the thermoelectric elements are possible depending upon the type of temperature measurements to be made. For example, where it is desired to make surface measurements on a planar body, the copper block 6 in the embodiment described in connection with Figure 1 will provide more surface contact than the point-like sensing element of Figure 2. On the other hand, the temperature to be measured by a device employing a copper block as in Figure 1 must be somewhat lower than the melting point of the copper block. This result is avoided in the embodiment shown in Figure 2.

It should be understood that the gold-nickel alloys employed in the present invention, as well as the iron-aluminum alloys employed, will contain the usual impurities present in commercial grades of these metals, which impurities are normally present in the final alloys. Furthermore, in the thermocouple device shown in Figure 1 other suitable p-type thermoelectric elements may be used instead of the preferred alloy. Suitable p-type elements may be selected from such alloys as ZnSb:Hg; 2(BiSb):3Te:Hg; and Chromel (80% nickel–20% chromium). These are not all of the ductile or high melting point type.

What is claimed is:

1. A thermocouple comprising a positive element, and a negative element composed of an alloy of from 78 to 85.5% by weight gold, balance nickel.

2. A thermocouple comprising a positive element, and a negative element composed of an alloy consisting of a ratio of 7 atoms of gold to 5 atoms of nickel.

References Cited in the file of this patent

UNITED STATES PATENTS

| | | |
|---|---|---|
| Re. 16,453 | Hermann | Nov. 2, 1926 |
| 874,780 | Marsh | Dec. 24, 1907 |
| 2,330,018 | Van Wert | Sept. 21, 1943 |

OTHER REFERENCES

Koester and Dannoehl: "Die Aushaertung der Gold-Nickel-Legierungen," Zeitschrift für Metallkunde, p. 248.